US009383549B2

(12) United States Patent
Ueno et al.

(10) Patent No.: US 9,383,549 B2
(45) Date of Patent: Jul. 5, 2016

(54) IMAGING SYSTEM

(71) Applicant: KABUSHIKI KAISHA TOSHIBA, Minato-ku (JP)

(72) Inventors: Risako Ueno, Meguro (JP); Kazuhiro Suzuki, Minato (JP); Mitsuyoshi Kobayashi, Ota (JP); Honam Kwon, Kawasaki (JP); Hideyuki Funaki, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/641,027

(22) Filed: Mar. 6, 2015

(65) Prior Publication Data

US 2015/0268450 A1 Sep. 24, 2015

(30) Foreign Application Priority Data

Mar. 20, 2014 (JP) ................................. 2014-059087

(51) Int. Cl.
*H04N 5/225* (2006.01)
*G02B 13/00* (2006.01)
*G02B 3/00* (2006.01)
*G01S 7/481* (2006.01)

(52) U.S. Cl.
CPC ........... *G02B 13/0015* (2013.01); *G01S 7/4813* (2013.01); *G02B 3/0056* (2013.01); *H04N 5/2254* (2013.01)

(58) Field of Classification Search
None
See application file for complete search history.

(56) References Cited

U.S. PATENT DOCUMENTS

| 7,962,033 B2 | 6/2011 | Georgiev et al. |
| 9,064,766 B2 * | 6/2015 | Honda ............. H01L 27/14627 |
| 2009/0074316 A1 | 3/2009 | Morita et al. |
| 2012/0218448 A1 | 8/2012 | Ueno et al. |
| 2014/0240559 A1 * | 8/2014 | Ueno .................... H04N 5/335 348/294 |

FOREIGN PATENT DOCUMENTS

| JP | 2003-032672 | 1/2003 |
| JP | 2005-172622 | 6/2005 |
| JP | 2008-275366 | 11/2008 |
| JP | 2009-87329 | 4/2009 |
| JP | 2012-178693 | 9/2012 |

* cited by examiner

*Primary Examiner* — Gary C Vieaux
(74) *Attorney, Agent, or Firm* — Oblon, McClelland, Maier & Neustadt, L.L.P

(57) ABSTRACT

According to an embodiment, an imaging system includes an image sensor, an imaging lens, a microlens array, an irradiator, a distance information acquiring unit, and a controller. The microlens array includes multiple microlenses arranged with a predetermined pitch, the microlenses being respectively associated with pixel blocks. The irradiator emits light to project a pattern onto an object. The distance information acquiring unit acquires information on the distance in the depth direction to the object on the basis of a signal resulting from photoelectric conversion performed by the image sensor. The controller controls the irradiator so that images contained in a pattern that is reflected by the object and scaled down on the image sensor by the imaging lens and the microlenses are smaller than the arrangement pitch of images each formed on the image sensor by each microlens and larger than twice the pixel.

6 Claims, 17 Drawing Sheets
(1 of 17 Drawing Sheet(s) Filed in Color)

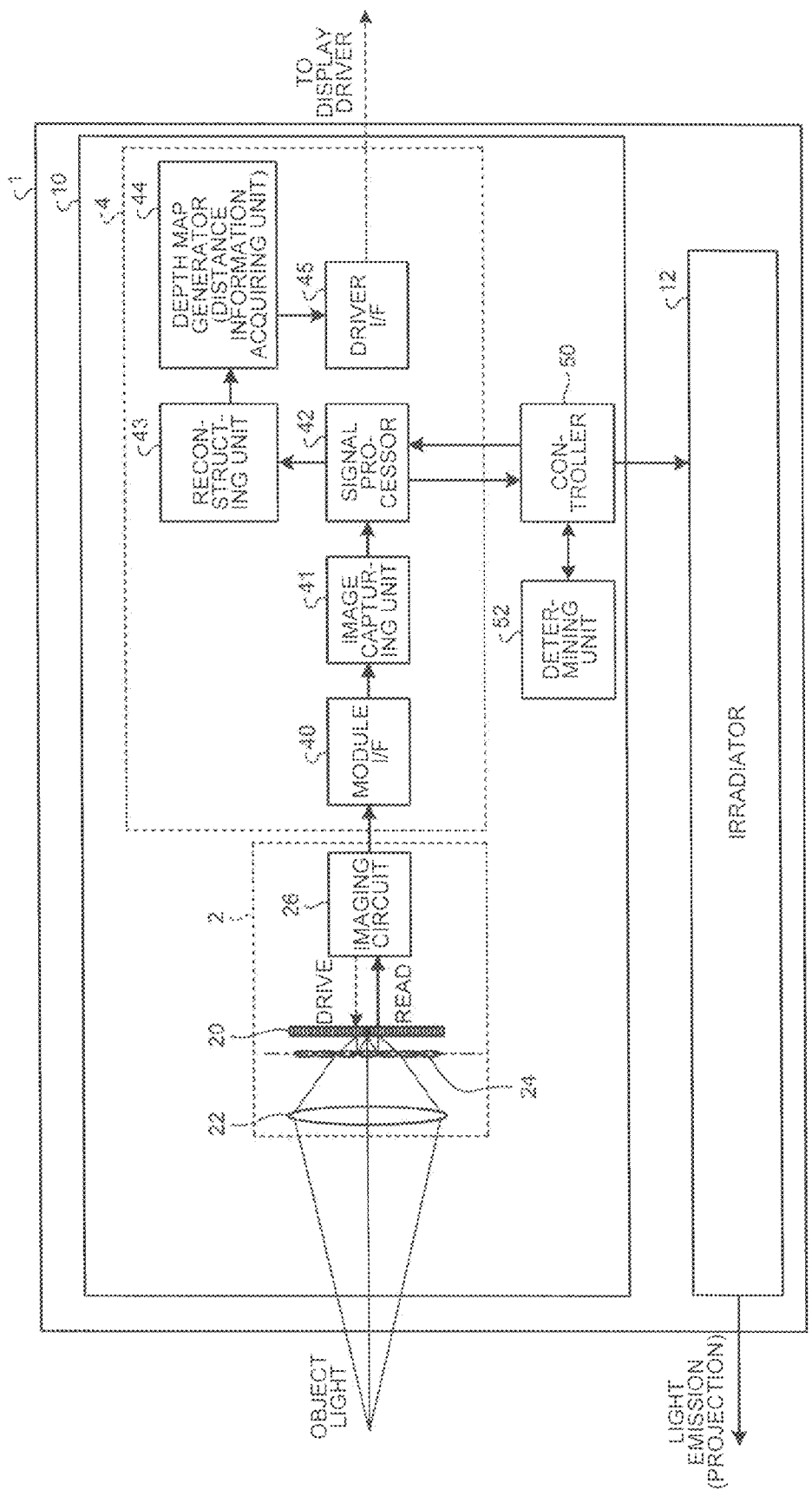

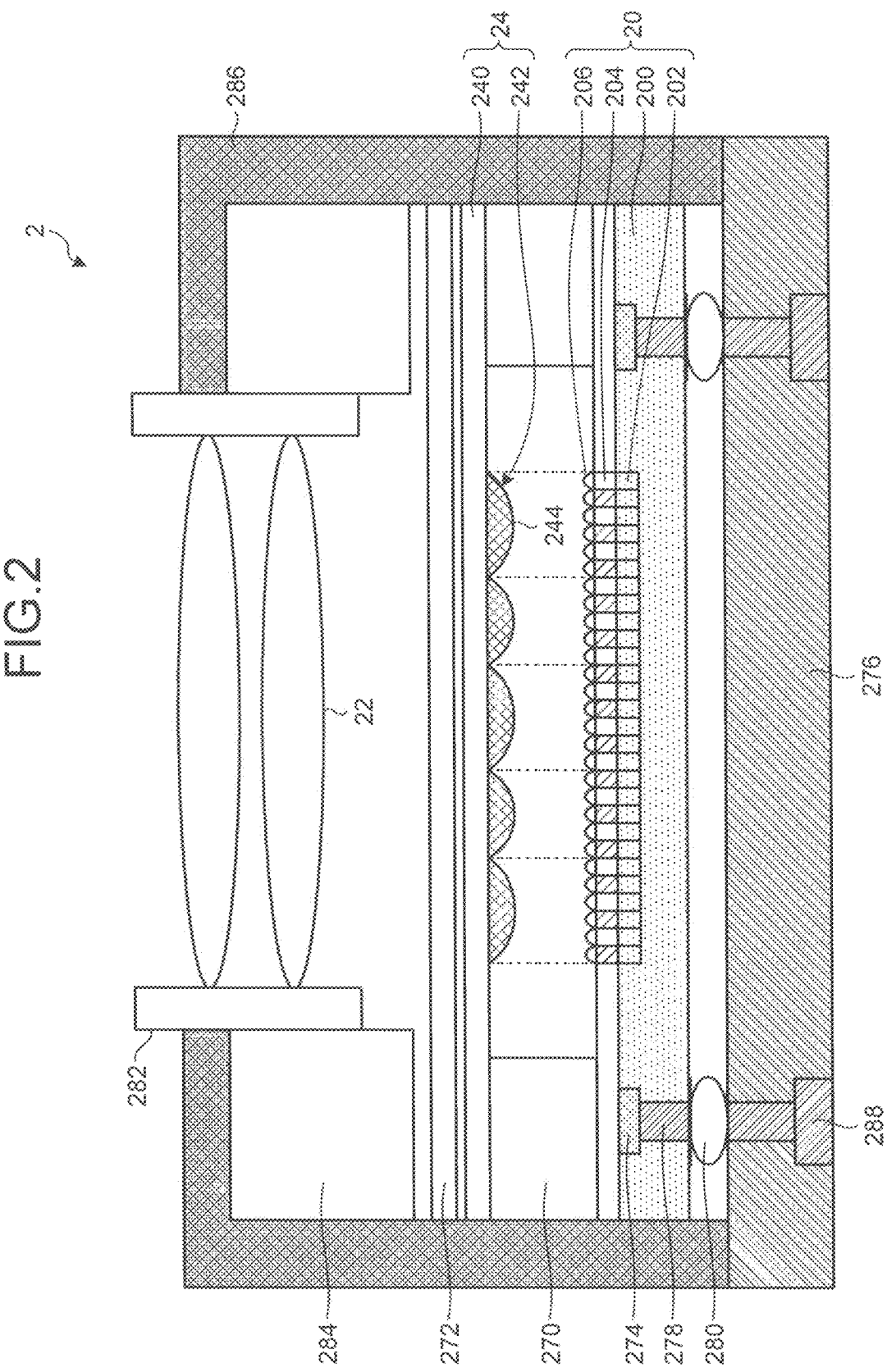

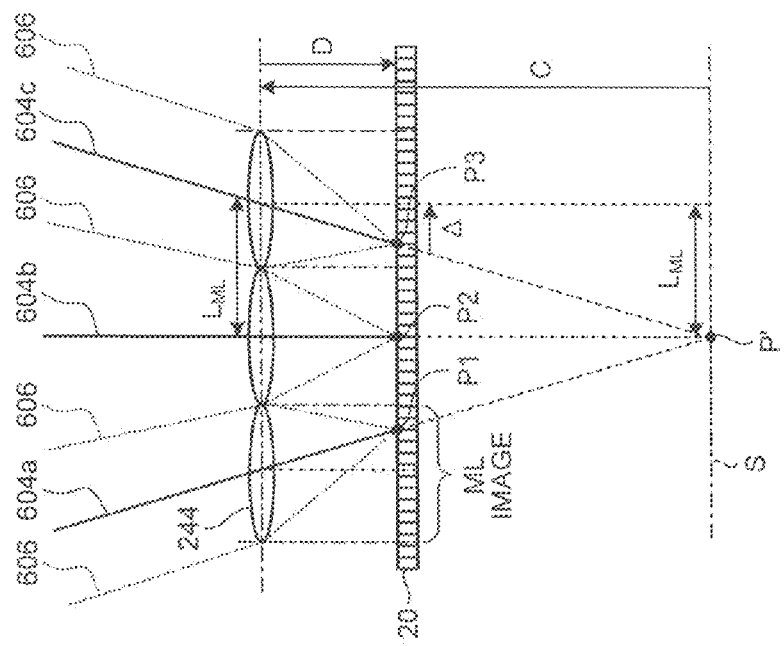
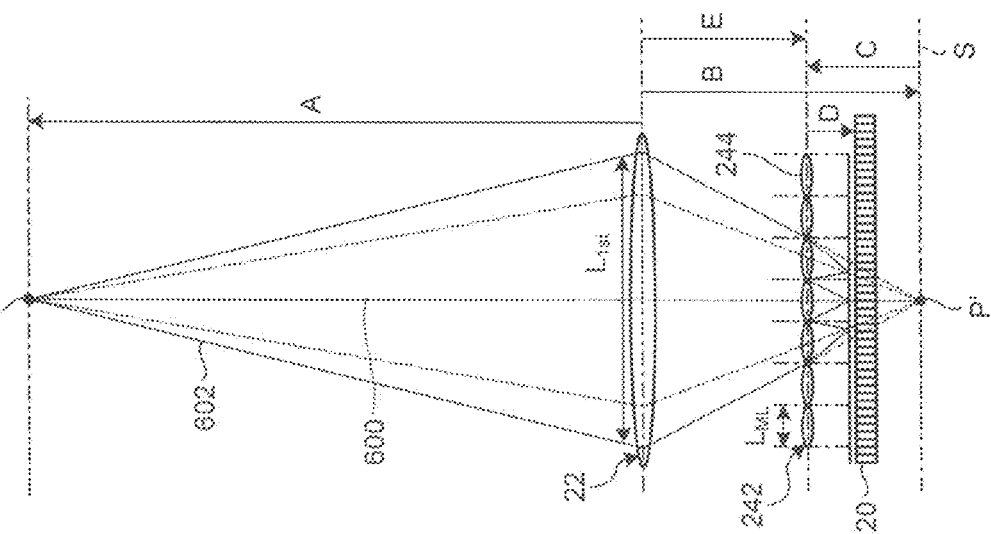

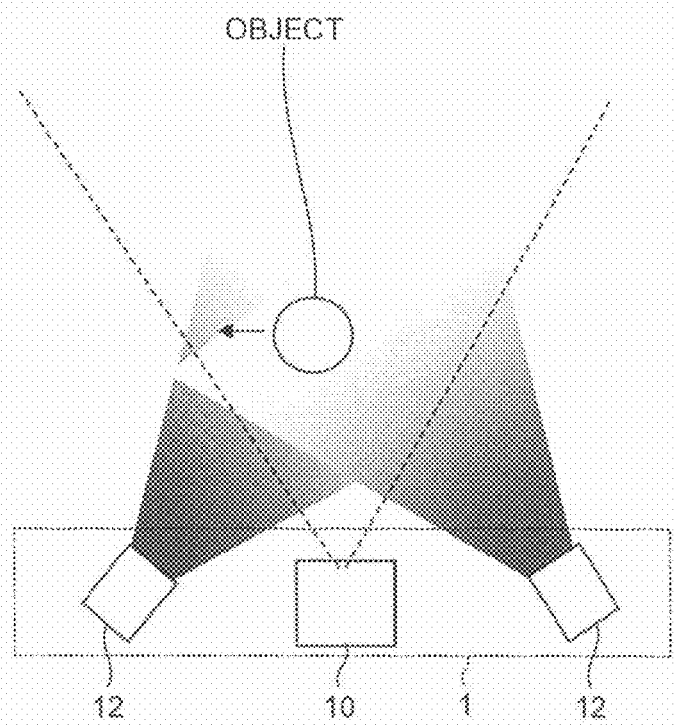

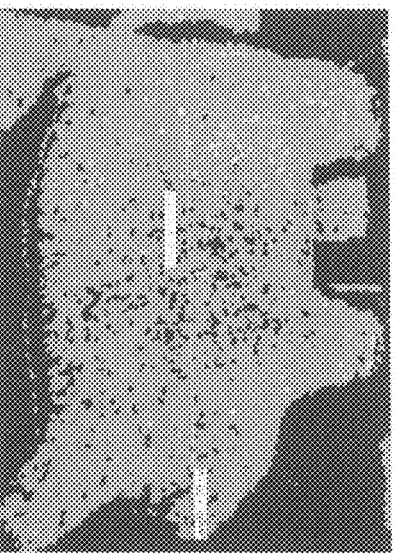
FIG.7C DEPTH MAP
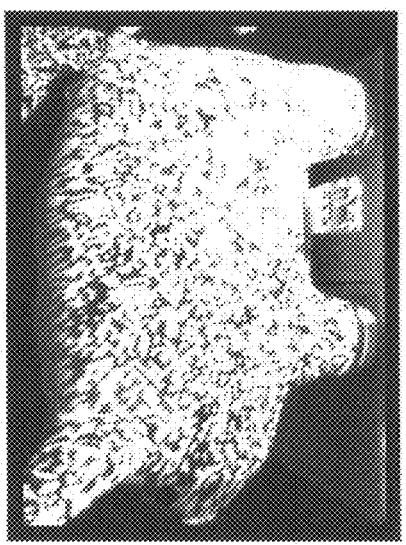
FIG.7B RECONSTRUCTED IMAGE
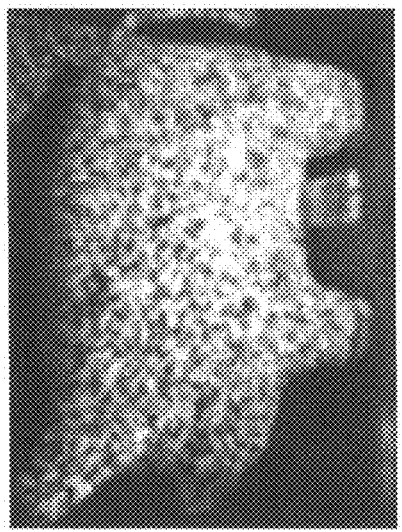
FIG.7A ML IMAGE
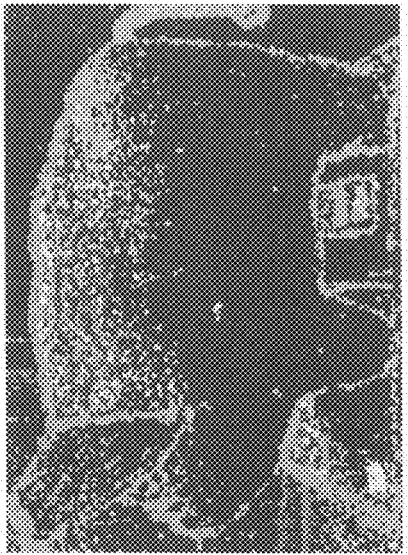
FIG.7F DEPTH MAP
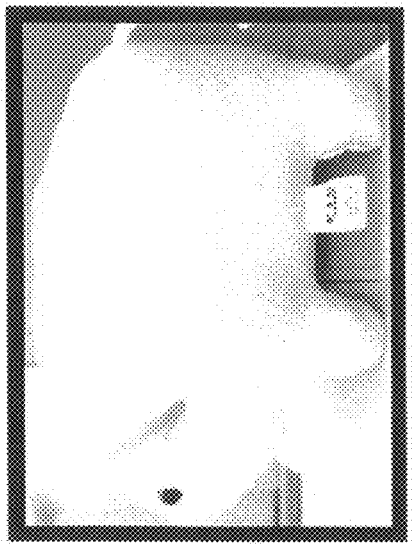
FIG.7E RECONSTRUCTED IMAGE
FIG.7D ML IMAGE

ML IMAGE

RECONSTRUCTED IMAGE
(SURFACE IMAGE)

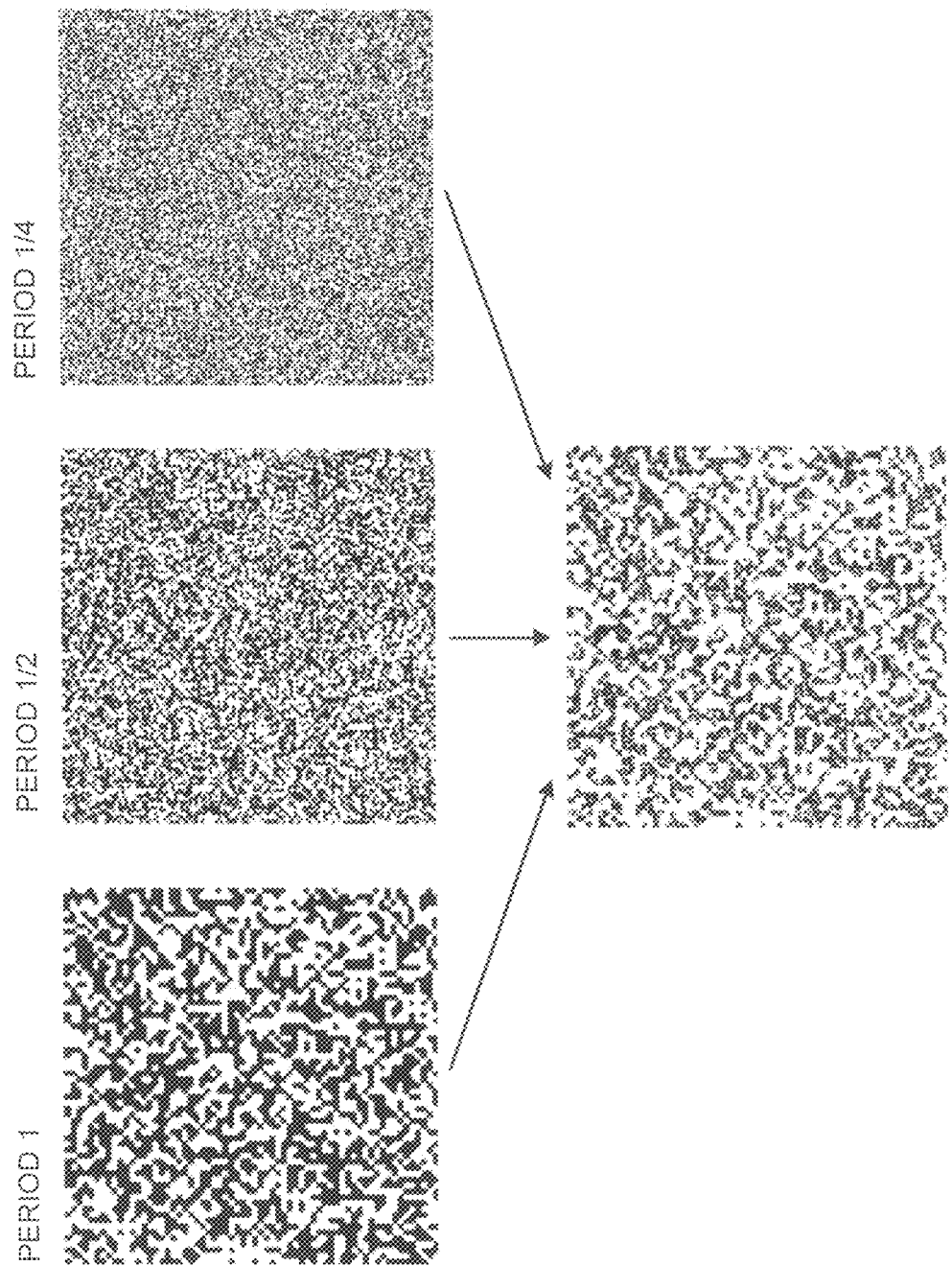

IMAGING SYSTEM

CROSS-REFERENCE TO RELATED APPLICATIONS

This application is based upon and claims the benefit of priority from Japanese Patent Application No. 2014-059087, filed on Mar. 20, 2014; the entire contents of which are incorporated herein by reference.

FIELD

Embodiments described herein relate generally to an imaging system.

BACKGROUND

Imaging technologies capable of acquiring a distance in the depth direction to an object (a depth map) as two-dimensional information include various techniques such as a technology of measuring the intensity and the return time of light reflected by an object by using reference light, a stereo distance measuring technology using multiple cameras, and the like. Depth map information allows more advance object recognition than image information acquired from normal cameras, and there is therefore a growing need for such depth map information as additional input information in relatively inexpensive products such as home electric appliances, game products, and industrial products.

Furthermore, among distance imaging techniques, there is known imaging devices with a compound-eye structure including an imaging lens that is a structure capable of acquiring a number of parallaxes by using a single camera and allowing distance measurement based on triangulation.

Sensor units such as cameras mounted on terminal devices such as portable terminals and cleaning robots are required to be capable of acquiring high-resolution, two-dimensional visible images, small and low in height (thin), and low in power consumption. Furthermore, in the future, new ways of using imaging modules with additional sophisticated functions such as gesture input and depth map acquisition are required in addition to visible image acquisition.

Cameras having a microlens array and multi-parallax passive depth map cameras such as a multiple-camera setup of related art can estimate distance without light sources (lasers, LEDs, etc.) and are therefore suitable for low power consuming, small devices driven by batteries, but are disadvantageous in principle in that distance cannot be measured when an object has no texture (difference in luminance).

In the meantime, when a system including active illumination means is used in a multi-parallax system such as a stereo camera, calibration of alignment between cameras and alignment between a camera and the active illumination means is required, and there is a disadvantage that occurrence of misalignment results in degradation in accuracy. Furthermore, when multiple systems are used, there is a disadvantage that a light source pattern emitted by one device may interfere with a light source pattern from another device, which causes an error.

BRIEF DESCRIPTION OF THE DRAWINGS

The patent or application file contains at least one drawing executed in color. Copies of this patent or patent application publication with color drawing(s) will be provided by the Office upon request and payment of the necessary fee. A more complete appreciation of the invention and many of the attendant advantages thereof will be readily obtained as the same becomes better understood by reference to the following detailed description when considered in connection with the accompanying drawings, wherein:

FIG. 1 is a configuration diagram illustrating a configuration of an imaging system according to an embodiment;

FIG. 2 is a diagram schematically illustrating a cross section of an imaging module;

FIGS. 3A and 3B are diagrams illustrating geometric optical relations in an optical system of an imaging device;

FIG. 6 is a diagram illustrating an example of relative positions of the imaging system and an object according to the embodiment;

FIGS. 7A and 7D illustrate ML images with and without a pattern, respectively, FIGS. 7B and 7E illustrate reconstructed images with and without a pattern, respectively, and FIGS. 7C and 7F illustrate depth maps with and without a pattern, respectively;

FIG. 11 illustrates a pattern combining random patterns with different periods;

DETAILED DESCRIPTION

Figure 4:
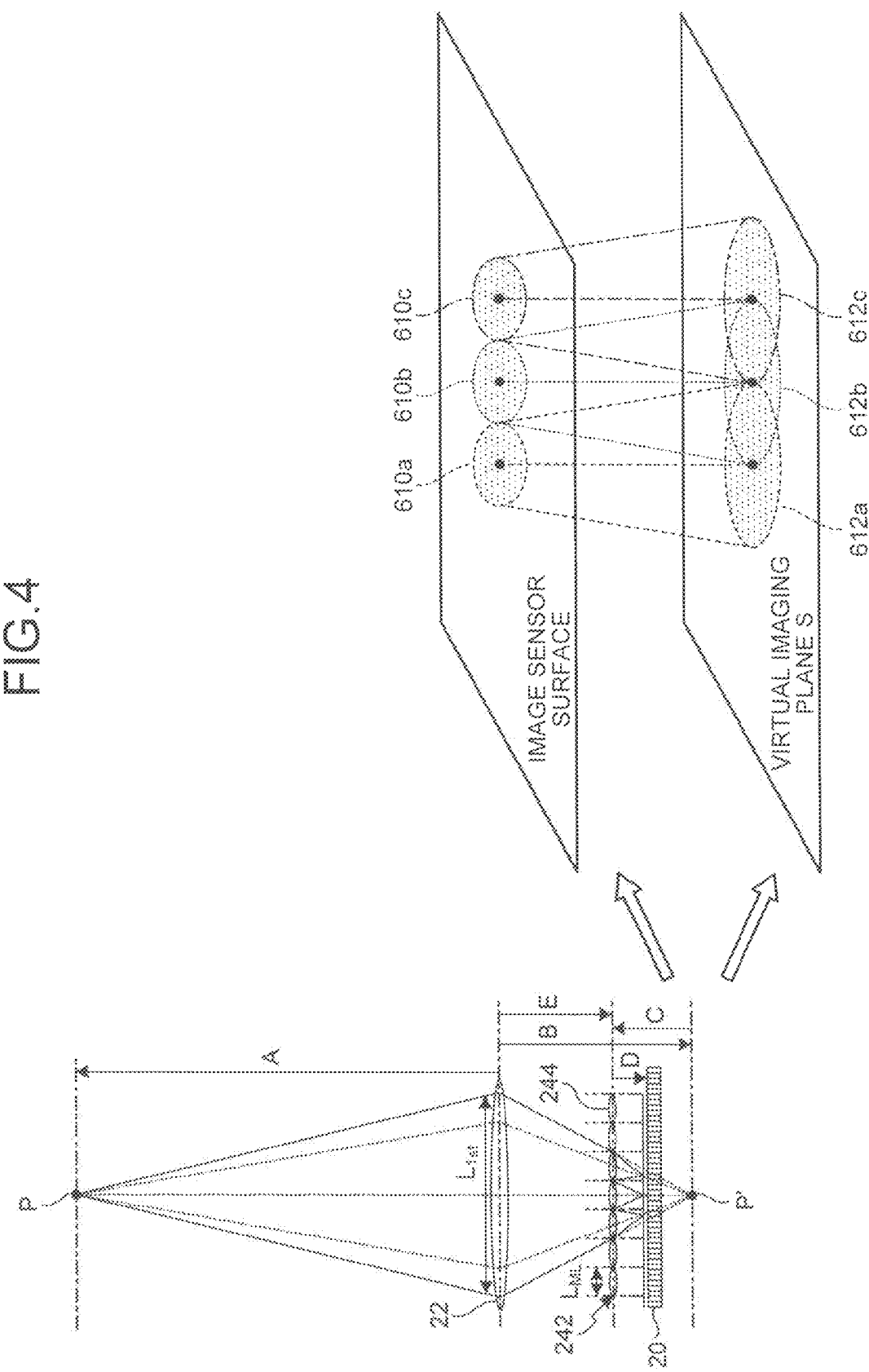
FIG. 4 is a diagram schematically illustrating a method of reconstructing a two-dimensional visible image by a reconstructing unit.

According to an embodiment, an imaging system includes an image sensor, an imaging lens, a microlens array, an irradiator, a distance information acquiring unit, and a controller. The image sensor includes multiple pixel blocks each containing multiple pixels configured to carry out photoelectric conversion. The imaging lens focuses light from an object onto a virtual imaging plane. The microlens array is provided between the image sensor and the imaging lens and includes multiple microlenses arranged with a predetermined pitch. The microlenses are respectively associated with the pixel blocks. The irradiator emits light to project a pattern onto the object. The distance information acquiring unit acquires information on distance in a depth direction to the object on the basis of a signal resulting from photoelectric conversion performed by the image sensor. The controller controls the irradiator so that the pattern formed on the image sensor satisfies the following expressions (1) and (2):

$$fp = Fpt \times M \times N \quad (1), \text{ and}$$

$$1/L_{ML} < Fpt \times M \times N < 1/2 dpix \quad (2),$$

where fp represents a frequency of an image formed on the image sensor, Fpt represents a frequency of the pattern, M represents a magnification of the imaging lens, N represents a magnification of the microlenses, $L_{ML}$ represents a distance between the microlenses, and dpix represents a pixel size.

An imaging system according to an embodiment will be described below with reference to the accompanying drawings.

Embodiment

FIG. 1 is a configuration diagram illustrating a configuration of an imaging system 1 according to the embodiment. The imaging system 1 includes an imaging device 10 and an irradiator 12, and is capable of outputting a visible image and a depth map. The imaging system 1 may include multiple irradiators 12 (see FIG. 6).

The imaging device 10 includes an imaging module 2, an image signal processor (ISP) 4, a controller 50, and a determining unit 52. The imaging module 2 includes an image sensor 20, an imaging optical system (imaging lens) 22, a microlens array (MLA) 24, and an imaging circuit 26.

The image sensor 20 functions as an element that converts light captured by the imaging optical system 22 into a signal charge in units of pixels, and includes multiple pixels (photodiodes, for example, which are photoelectric conversion elements) arranged in a two-dimensional array. The imaging optical system 22 functions as an imaging optical system that captures light from an object into the image sensor 20. The image sensor includes multiple pixel blocks arranged in a two-dimensional array. Each of the pixel blocks includes multiple pixels arranged in a two-dimensional array.

The microlens array 24 is a micro-optical system such as a microlens array or a prism having multiple microlenses, for example. The microlens array 24 functions as an optical system that scales down and re-images a group of light beams focused on an imaging surface by the imaging optical system 22 to pixel blocks associated with individual microlenses (MLs).

The imaging circuit 26 includes a drive circuit part (not illustrated) configured to drive the pixels of the image sensor 20, and a pixel signal processing circuit part (not illustrated) configured to process signals output from pixel regions. The drive circuit part includes a vertical selection circuit configured to sequentially select pixels to be driven in units of horizontal lines (rows) in the vertical direction, an horizontal selection circuit configured to sequentially select pixels in units of columns, and a timing generator (TG) circuit configured to drive the selection circuits by various pulses, for example. The pixel signal processing circuit part includes an A/D conversion circuit configured to convert analog electric signals from the pixel regions into digital signals, a gain adjustment/amplification circuit configured to carry out gain adjustment and amplification, and a digital signal processing circuit configured to carry out correction of digital signals and the like, for example.

The ISP 4 includes a module interface (I/F) (camera module interface) 40, an image capturing unit 41, a signal processor 42, a reconstructing unit 43, a depth map generator 44, and a driver interface (I/F) 45. The module I/F 40 is an interface that receives a RAW image taken by the imaging module 2 and outputs the RAW image to the image capturing unit 41. The image capturing unit 41 captures the RAW image taken by the imaging module 2 via the module I/F 40.

The signal processor 42 carries out signal processing on the RAW image captured by the image capturing unit 41 to generate images (microlens images: ML images) each imaged for each microlens, for example. The signal processor 42 also outputs data (multiple ML images: a compound-eye image) on which signal processing is carried out to the reconstructing unit 43 and the controller 50.

The reconstructing unit 43 uses the ML images (compound-eye image) generated by the signal processor 42 to reconstruct an RGB image (two-dimensional visible image) corresponding to the object, for example. The depth map generator 44 uses the ML images (compound-eye image) resulting from the signal processing by the signal processor 42, the image of the object resulting from the reconstruction by the reconstructing unit 43, or a pixel signal corresponding to reflected light from the object, which will be described later, to generate an image (depth map) representing information on the distance in the depth direction to the object, for example. Specifically, the depth map generator 44 also has functions of a distance information acquiring unit that acquires the information on the distance in the depth direction to the object and allows output of the information.

The driver I/F 45 outputs the image (visible image) of the object resulting from the reconstruction by the reconstructing unit 43 and an image signal representing the depth map generated by the depth map generator 44 to a display driver that is not illustrated. The display driver displays the visible image taken by the imaging system 1, the depth map, and the like.

The controller 50 controls the respective components included in the imaging system 1 according to signals or the like resulting from signal processing by the signal processor 42, for example. The determining unit 52 receives a signal resulting from signal processing by the signal processor 42 via the controller 50, determines whether or not the depth map generator 44 can generate a depth map (or acquire distance information) on the basis of the received signal, and outputs the determination result to the controller 50. When light emitted by the irradiator 12 is in an off state, for example, the determining unit 52 determines whether or not the depth map generator 44 can acquire distance information (whether or not the depth map generator 44 can generate a depth map) on the basis of a signal resulting from photoelectric conversion performed by the image sensor 20). The determining unit 52 may use the ML images (compound-eye image) resulting from the signal processing by the signal processor 42, the image of the object resulting from the reconstruction by the reconstructing unit 43, or a pixel signal corresponding to reflected light from the object to determine whether or not the depth map generator 44 can acquire the distance information (whether or not the depth map generator 44 can generate a depth map). The controller 50 also controls the components of the imaging system 1 according to the determination result from the determining unit 52.

The irradiator 12 emits light to project a pattern onto the object, which will be described later. The irradiator 12 may be capable of switching ON/OFF, the wavelength, and the intensity of light to be emitted, the magnification of the pattern to be projected, etc., according to control by the controller 50.

As described above, the imaging system 1 includes a single sensor (the image sensor 20), a single lens (the imaging optical system 22), microlenses (included in the microlens array 24), and the irradiator 12, and is capable of taking visible images and depth maps.

Next, the configuration of the imaging module 2 will be described in detail. FIG. 2 is a diagram schematically illustrating a cross section of the imaging module 2. As illustrated in FIG. 2, the image sensor 20 includes a semiconductor substrate 200 and multiple pixels 202 each having a photodiode and formed at the top of the semiconductor substrate 200. The pixels 202 each have a color filter 204 of R, G, B or W, for example, at the top. The color filters 204 of R have high transmissivity to light in the red wavelength range. The color filters 204 of G have high transmissivity to light in the green wavelength range. The color filters 204 of B have high transmissivity to light in the blue wavelength range. The color filters 204 of W have light in the wavelength range including the red wavelength range, the green wavelength range, and the blue wavelength range. The rule for arrangement of the color filter 204 will be described later. In addition, the color filters 204 may each have at the top thereof a microlens 206 for collecting light to each pixel.

A microlens array 24 is arranged above the color filters 204. The microlens array 24 includes a visible light transmitting substrate 240 and a microlens unit 242 formed thereon, for example. The microlens unit 242 is provided on the side of the visible light transmitting substrate 240 facing the image sensor 20, and includes multiple microlenses 244 arranged two-dimensionally in an array with a predetermined pitch, for example.

The microlenses 244 each correspond to a pixel block including multiple pixels 202 provided on the semiconductor substrate 200, and function as optical systems that scale down and focus (collect) light onto the corresponding pixel blocks. Each pixel block is a block in which 20 to 30 pixels are arranged in the diametrical direction or along a side thereof, for example. Each pixel block may have a structure including 10 to 100 pixels arranged in the diametrical direction or along a side thereof, for example, depending on the use of the image sensor 20.

Furthermore, the visible light transmitting substrate 240 is connected to the semiconductor substrate 200 by a spacer 270 made of a resin material provided around an imaging region in which the pixels 202 are formed. Note that alignment for connecting the semiconductor substrate 200 and the visible light transmitting substrate 240 are carried out with reference to an alignment mark or the like that are not illustrated.

An optical filter 272 may be provided on the microlens array 24. For example, when the visible light transmitting substrate 240 does not have a function of blocking light in an unnecessary wavelength range, an optical filter having a function of blocking light in an unnecessary wavelength range may be arranged. Light in an unnecessary wavelength range refers to light in a wavelength range other than the wavelength ranges transmitted by the color filters 204, for example. In order to distinguish red (R) and near-infrared (NIR) from each other, for example, an optical filter for blocking light in a wavelength range there between may be used.

Furthermore, the semiconductor substrate 200 is provided with an electrode pad 274 allowing signals output from the pixels 202 to be read. A through electrode 278 extending through the semiconductor substrate 200 and making the semiconductor substrate 200 in electric continuity with a processing and driving chip 276 is formed under the electrode pad 274.

The semiconductor substrate 200 is electrically connected to the processing and driving chip 276 via the through-electrode 278 and a bump 280. The processing and driving chip 276 has formed thereon a driving and processing circuit (imaging circuit 26) that drives the image sensor 20 and processes a signal read from the image sensor 20. Note that the connection between the semiconductor substrate 200 and the processing and driving chip 276 is not limited to the electric connection via the through-electrode 278, but electrode pads provided on the semiconductor substrate 200 and the processing and driving chip 276 (the respective chips) may be connected by a metal wire or the like.

Furthermore, the imaging optical system (imaging lens) 22 is provided above the visible light transmitting substrate 240. The imaging optical system 22 may include a plurality of imaging lenses. The imaging optical system 22 is attached to a lens barrel 282. The lens barrel 282 is attached to a lens holder 284. The attachment position of the imaging optical system 22 may be adjusted by the pressing pressure of the lens holder 284 when the lens holder 284 is attached. It is possible to determine the attachment position of the lens holder 284 while observing an output image on the basis of the relation between the pressing pressure and the output image.

The imaging module 2 also has a light shielding cover 286 attached thereto to block unnecessary light toward the semiconductor substrate 200, the visible light transmitting substrate 240, and the processing and driving chip 276. The imaging module 2 is also provided in a lower part of the processing and driving chip 276 with a module electrode 288 that electrically connect the processing and driving chip 276 and an external device.

Next, geometric optical relations in an optical system (virtual image optical system) in the imaging device 10 will be described. FIGS. 3A and 3B are diagrams illustrating the geometric optical relations in the optical system of the imaging device 10. In FIGS. 3A and 3B, for simplicity, only a range in the vicinity of the optical axes of imaging lenses is drawn. FIG. 3B is an enlarged view of the vicinity of the optical axes of the microlenses 244 illustrated in FIG. 3A.

In a case where only the imaging optical system (imaging optical system 22) is considered, a principal ray 600 and peripheral rays 602 that are rays of the same group as the principal ray 600 from an object point P on the optical axes are focused by the imaging optical system 22 onto a virtual imaging plane S determined by the focal length f of the imaging optical system and the distance A between the imaging optical system 22 and the object point P so that the relation of the following Expression 1 is satisfied:

$$\frac{1}{f} = \frac{1}{A} + \frac{1}{B} \quad (1)$$

In the expression, f represents the focal distance of the imaging optical system (imaging lens) 22, A represents the distance from a principal plane of the imaging optical system 22 facing the object to the object point P, and B represents the distance from a principal plane of the imaging optical system 22 facing the image to a virtual imaging point P'. Note that the principal plane facing the object and the principal plane facing the image of the imaging optical system 22 are coincident in the figures. In addition, an image magnification (horizontal magnification) M of the imaging optical system 22 is expressed by the following Expression 2:

$$M = \frac{B}{A} \quad (2)$$

Note that the virtual imaging point P' of the imaging optical system 22 is located behind the image sensor 20 (opposite to the object). In this case, since the microlenses 244 are arranged in front of the virtual imaging point P' (closer to the object than the virtual imaging point P'), light is collected to the surface on which the pixels 202 of the image sensor 20 located in front of the virtual imaging plane S are provided. Thus, the light ray group (the principal ray 600 and the peripheral rays 602) is scaled down and focused in a virtual image relationship. The imaging system of the microlenses 244 is expressed by the following Expression 3:

$$\frac{1}{g} = \frac{1}{C} + \frac{1}{D} \quad (3)$$

In the expression, g represents the focal length of the microlenses 244, C represents the distance from the principal plane of the microlenses 244 facing the object to the virtual imaging point P', and D represents the distance from the principal plane of the microlenses 244 facing the image to the imaging point of the microlenses 244. In this case, the image magnification (image reduction ratio) N of the imaging system of the microlenses 244 is expressed by the following Expression 4:

$$N = \frac{D}{C} \quad (4)$$

The image reduction ratio of the reduction of an image formed by the imaging optical system 22 by the microlens array 24 is not smaller than 0.001 and not larger than 0.87, for example. Here, a variable E of the following Expression 5 is introduced on the basis of a geometrical relation. When the optical system is a fixed focus optical system, the variable E is a fixed designed value.

$$E = B - C \quad (5)$$

When two adjacent microlenses 244 are selected, the arrangement pitch of the microlenses 244 or the distance between the microlenses 244 is represented by $L_{ML}$. In this case, the group of light rays 604a, 604b, 604c, and 606 coming from the same object are distributed and focused to multiple imaging points p1, p2, p3, ... by multiple microlenses 244 adjacent to one another. $L_{ML}$ and the image shift amount Δ on one side are expressed by the following Expression 6 on the basis of the geometrical relation of the principal rays 604a, 604b, and 604c for the respective microlenses 244 illustrated in FIG. 3B:

$$\frac{C}{L_{ML}} = \frac{D}{\Delta} \quad (6)$$

Furthermore, the distance A between the object and the imaging optical system 22 and the image shift amount Δ satisfy the relation expressed by the following Expression 7 according to the expressions (1), (2) and (6):

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{DL_{ML}}{\Delta}}\right)^{-1} \quad (7)$$

Note that f, E, and $L_{ML}$ are designed parameters and are therefore known fixed values. Thus, the image shift amount Δ and the distance D are uniquely determined for the distance A by the above Expression 7. Since the amount of change in the distance D is very small compared to the amount of change in the distance A, the distance D is assumed to be a fixed value D0. The fixed value D0 represents the distance from the principal plane of the microlenses 244 facing the image to the surface of the image sensor 20. In this case, the above Expression 7 is expressed as in the following Expression 8:

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{D_0 L_{ML}}{\Delta}}\right)^{-1} \quad (8)$$

In the expression, since f, E, D0, and $L_{ML}$ are known designed values, the distance A to the object can be calculated if the image shift amount Δ can be detected from the surface of the image sensor 20. To obtain the image shift amount Δ between the image points p1, p2, p3, ... when light rays from the same object point P are focused to the image points p1, p2, p3, ... by the imaging optical system 22 and the microlenses 244, image matching between adjacent microlens images (ML images) taken by the image sensor 20 is used.

For the image matching, a known template matching method of finding out similarity or dissimilarity between two images can be used, for example. Furthermore, for obtaining shift positions with higher accuracy, the similarities obtained for the respective pixels may be interpolated by using a continuous fitting function or the like, and sub-pixel positions where the fitting function is the greatest and the smallest may be obtained to obtain the shift amounts with high accuracy.

Next, a method of reconstructing a two-dimensional visible image by the reconstructing unit 43 will be described. FIG. 4 is a diagram schematically illustrating the method of reconstructing a two-dimensional visible image by the reconstructing unit 43. The reconstructing unit 43 reconstructs a two dimensional image with no overlap from a group of microlens images (ML images) obtained by taking the same object multiple times.

Assume a case in which three microlenses 244 adjacent to one another form microlens images 610a, 610b, and 610c on the surface of the image sensor 20 as illustrated in FIG. 4, for example. In this manner, to form microlens images that do not overlap with one another, it is only necessary that the effective F number of the imaging optical system 22 and the effective F number of the microlenses 244 be the same.

The fields of view in which the microlens images 610a, 610b, and 610c are formed are a field of view 612a, a field of view 612b, and a field of view 612c, respectively, on the virtual imaging plane S, which are ranges overlapping with one another as illustrated in FIG. 4. FIG. 4 illustrates a case in which the image reduction ratio N is 0.5. Thus, as a result of multiplying the respective fields of view by 0.5, every object point is taken twice or more times.

When the relation N=0.5 is met, an image on the virtual imaging plane S can be reproduced by multiplying each microlens image by 1/N, that is, 2. To obtain the image reduction ratio N from the group of microlens images resulting from imaging, derivation of the following Expression 9 from the relations of the above expressions (4) and (6) is used:

$$N = \frac{D}{C} = \frac{\Delta}{L_{ML}} \quad (9)$$

Since the pitch $L_{LM}$ of the microlenses 244 is known, the image reduction ratio N can be obtained when the shift amount Δ of the same object is obtained from the images.

When images are combined to reconstruct a two-dimensional image, the reconstructing unit 43 first performs a white balance process of adjusting the balance of B, G, and R signals on a compound-eye RAW image output by the image sensor 20. Subsequently, since there is no signal information of G and B at the position of an R pixel, for example, the reconstructing unit 43 performs a demosaicing process of referring to pixels arranged around the R pixel and generating G and B signals estimated from the pixels. In a simple manner, a process of averaging surrounding pixels may be performed, but various methods can be used, such as referring to pixels in a wider range where necessary. The reconstructing unit 43 also performs these processes similarly on G pixels and B pixels.

Subsequently, the reconstructing unit 43 associates pixel signal values Sp1, Sp2, Sp3, . . . , Spn taken by the image sensor 20 for image points p1, p2, p3, . . . pn corresponding to one object point P as illustrated in FIG. 3A with a signal S'p resulting from combination in n-to-one correspondence. The association is carried out by detecting the relation of the image shifts Δ and the overlap relations of the fields of view from the images as described above. The reconstructing unit 43 then performs combination by a two-dimensional image combining method as follows to obtain a two-dimensional image.

The pixel signal values Sp1, Sp2, Sp3, . . . , Spn are used for the combination to obtain a two-dimensional image. Noise values of the respective pixels are represented by Np1, Np2, Np3, . . . , Npn. First, the reconstructing unit 43 performs an luminance correcting process on the pixel signal values. Details of the luminance correcting process will be described in detail later, in which the reconstructing unit 43 multiplies the pixels signal values Sp1, Sp2, Sp3, . . . , Spn by luminance correction coefficients a1, a2, a3, . . . , an, respectively, determined by a method to be described later. Subsequently, the reconstructing unit 43 averages the values resulting from the multiplication as expressed by the following Expression 10 to obtain a combined signal value S'p. The noise values contained in the combined signal value in this case are similarly multiplied by coefficients, and are thus expressed by the following Expression 11.

$$S'_p = \{a_1 S_{p1} + a_2 S_{p2} + \ldots + a_n S_{pn}\}/n \quad (10)$$

$$N'_p = \{a^2_1 N^2_{p1} + a^2_2 N^2_{p2} + \ldots + a^2_n N^2_{pn}\}^{0.5}/n \quad (11)$$

Next, a method of acquiring distance information and generating a depth map by the depth map generator 44 will be described. As illustrated in FIGS. 3A and 3B, the distance A between the object and the imaging optical system 22 and the image reduction ratio N are in a one-to-one relationship determined according to geometric optics. Thus, when a shift amount Δ is obtained by the above Expression 9, the image reduction ratio N can be obtained since the pitch $L_{ML}$ of the microlenses 244 is a designed fixed value. Thus, the distance A from the object can be obtained from the relational expression of the distance A and the image reduction ratio N.

Figure 5A:
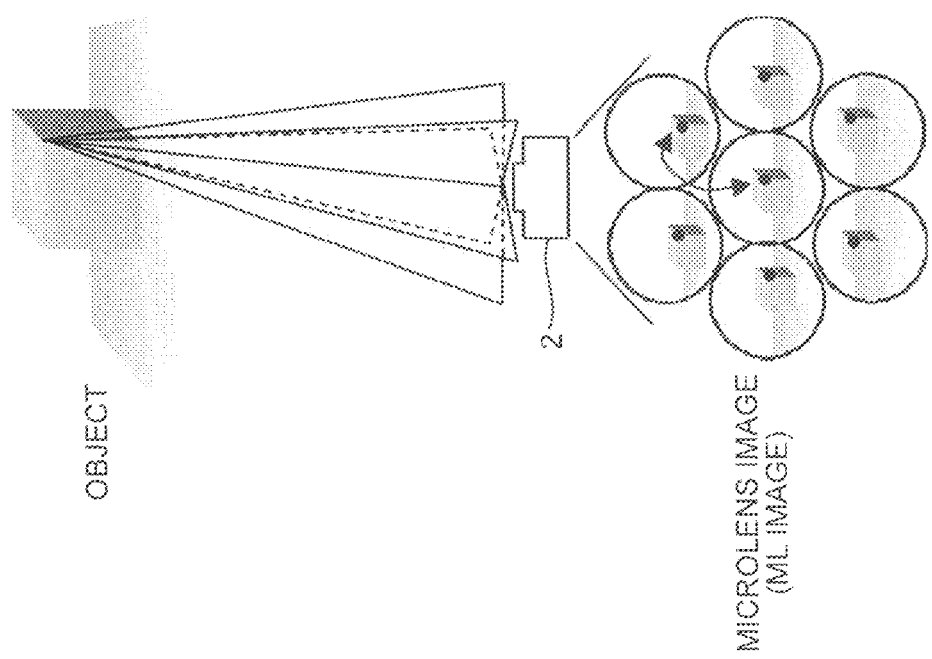
FIGS. 5A and 5B are diagrams schematically illustrating template matching of a ML image.
Figure 5B:
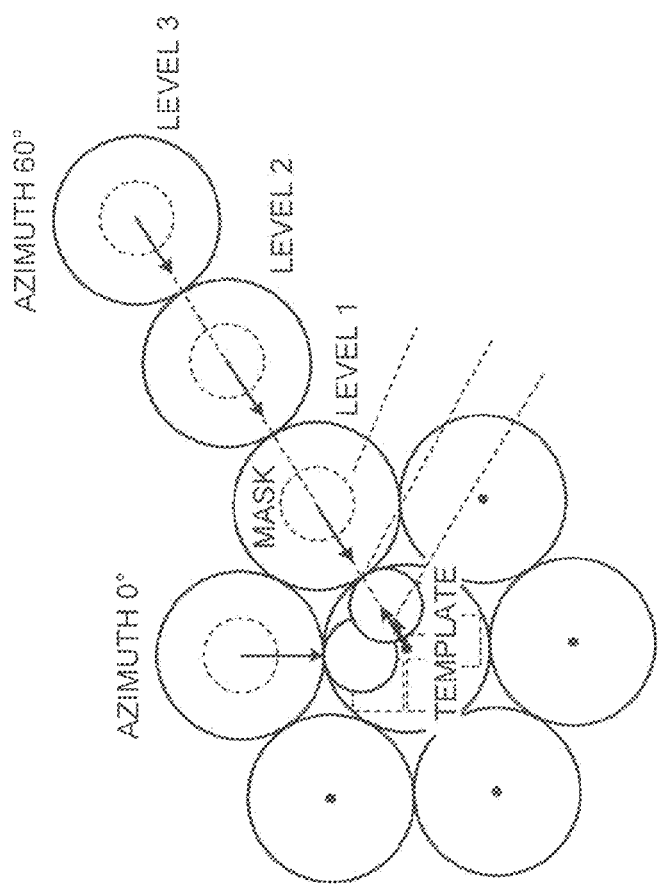

To obtain the shift amount A of an object from images, an image matching process of searching for and determining the positions of the same object points in adjacent microlens images is performed as illustrated in FIG. 5A. In this case, as illustrated in FIG. 5B, the ML image (level 1) nearest to the ML image to be searched for is used for calculation of a low magnification (a distant object) and the second nearest and the third nearest ML images (levels 2 and 3) are used for calculation of a high magnification (a nearby object). Furthermore, as illustrated in FIG. 5B, variation in searching may be reduced by obtaining shift amounts at six azimuth angles at 60 degree intervals and averaging or obtaining a median of the shift amounts to increase the accuracy to the ML image to be searched for, for example. The depth map generator 44 then obtains the shift amounts through the image matching process described above.

Next, the irradiator 12 will be described in detail. FIG. 6 is a diagram illustrating an example of relative positions of the imaging device 10 and irradiators 12 in the imaging system 1 and the object. In the example illustrated in FIG. 6, the imaging system 1 is provided with one irradiator 12 at each of the left and right sides of the imaging device 10.

The wavelength range of light that the irradiators 12 emit to project a pattern is a visible range, for example. Alternatively, the wavelength range of light from the irradiators 12 may be the near-infrared range (wavelength of about 750 nm to 950 nm), which will be described later. In the imaging device 10, the wavelength of light that can be subjected to photoelectric conversion by the image sensor 20 (that is, the filter property) is set depending on the wavelength of light emitted by the irradiators 12.

As illustrated in FIG. 6, the imaging system 1 may be provided with a plurality of irradiators 12 so that no shadow (dead angle) of projection to the object placed in the field of view of the imaging device 10 will be produced. Furthermore, the imaging system 1 may be designed to project a pattern from the side of the imaging module 2 in a manner that the angle of view of the projection and the angle of view of imaging match with each other, and configured to emit light by one irradiator 12.

Next, effects of projecting a pattern onto the object by the irradiator 12 will be described. FIGS. 7A and 7D illustrate ML images, FIGS. 7B and 7E illustrate reconstructed images, and FIGS. 7C and 7F illustrate depth maps, respectively, which are different depending on whether or not the irradiator 12 projects a pattern to the object. FIGS. 7A to 7C are a ML image, a reconstructed image, and a depth map when the irradiator 12 projects a pattern onto the object. FIGS. 7D to 7F are a ML image, a reconstructed image, and a depth map when the irradiator 12 does not project a pattern onto the object.

When a pattern is not projected, it is difficult to detect the distance to the object at a part other than the edge (where the texture changes). The area where it is difficult to detect the distance is the blue area in FIGS. 7C and 7F. In contrast, if a pattern is projected, an object having no texture can also be subjected to the matching process, which allows the distance to be detected. Specifically, when a pattern is projected onto the object as illustrated in FIG. 7C, the distance (depth) can be detected all over the object. The light blue area in FIG. 7C is the area where distance can be detected. Furthermore, as illustrated in FIG. 7E, the distance is erroneously detected in an area with much halation, and the distance is not detected in an area with no texture such as the body of the object. The area where the distance is erroneously detected is presented in red in FIG. 7F.

Next, the pattern to be projected by the light emitted by the irradiator 12 will be described in detail. While the "pattern" mentioned in the description below refers to a white and black stripe pattern in which a pair of white and black constitute one period for simplicity in the description below, the "pattern" is not limited thereto and may be a different pattern.

Figure 8A:
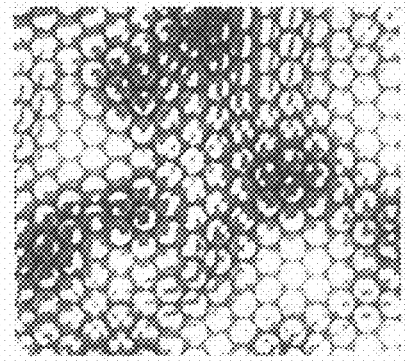
FIGS. 8A and 8B illustrate part of an ML image (multiple ML images) and part of a reconstructed image, respectively.
Figure 8B:

FIGS. 8A and 8B illustrate part of an ML image (multiple ML images) and part of a reconstructed image, respectively.

The ML image is formed on the surface of the image sensor 20. The reconstructed image is an image generated by the reconstructing unit 43.

An image of the object that is reduced by a magnification expressed by the following Expression 12 is formed by the imaging optical system 22 on the virtual imaging plane:

$$M = f/(A-f) \quad (12)$$

The image is further reduced at a ratio of N=D/C by the microlens array 24. Thus, with the system of the imaging system 1, the object is reduced at a ratio of M×N in total and imaged.

When the pattern image is reduced at a ratio of M×N, that is, by the magnification M of the imaging optical system 22 and by the magnification (reduction ratio) N of the microlenses 244, if the frequency of the reduced image is not larger than 1/2 of the Nyquist frequency in the microlenses 244 (not too small) and not smaller than $1/2L_{ML}$ (not too large), image matching can be performed by using the corresponding ML images and the distance can also be estimated. Thus, when the object is placed in front and the magnification N is large, it is necessary that the pattern will not be lost in gray in the microlenses images. Furthermore, to prevent false detection in the case where matching is performed, the pattern is preferably a random pattern (a non-periodic structure in the vertical and horizontal directions) or a pseudorandom pattern that is close to a random pattern.

Figure 9:
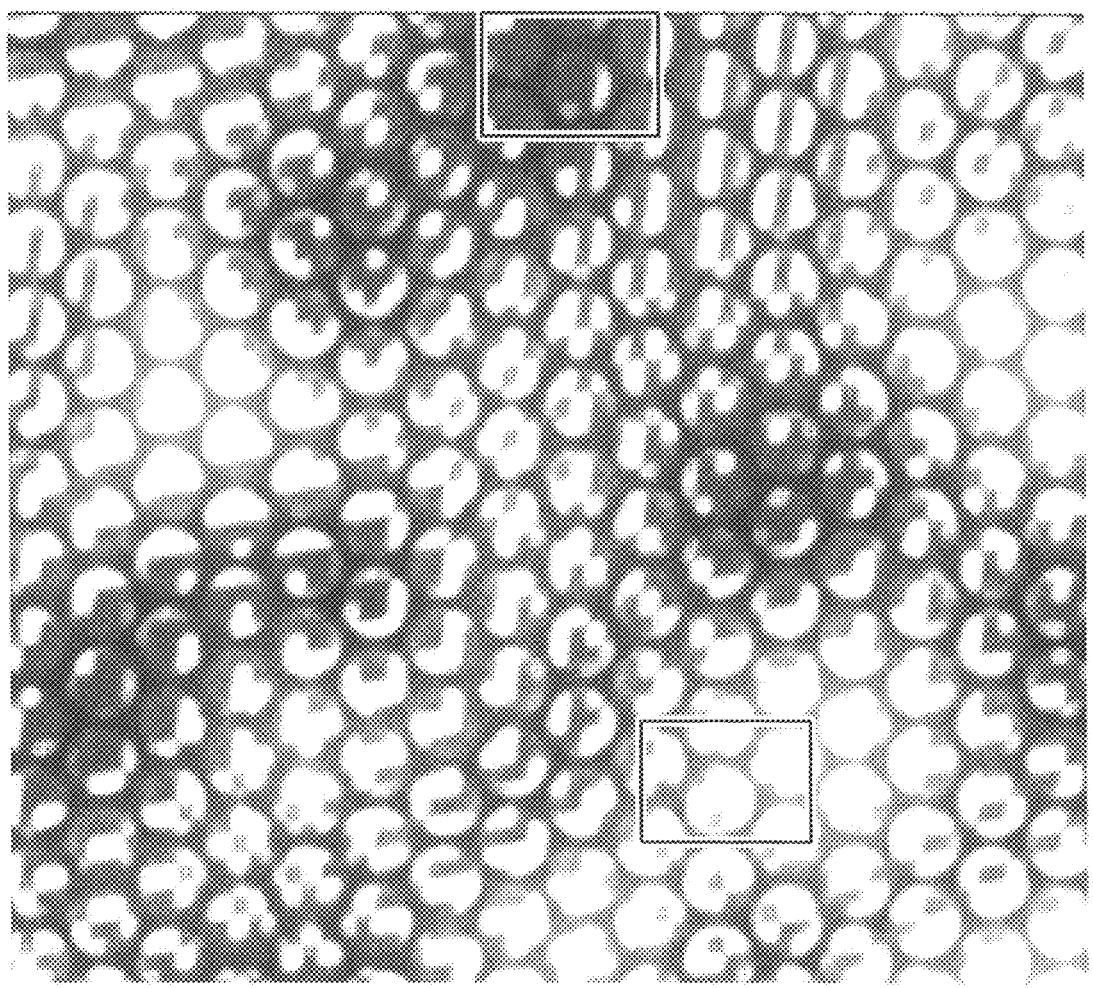
FIG. 9 illustrates an ML image with a high black occupancy ratio in a pattern and an ML image with a low black occupancy ratio in a pattern.

FIG. 9 illustrate an ML image with a high black occupancy ratio in the pattern and an ML image with a low black occupancy ratio in the pattern in order to explain the suitable size of the projected pattern. The imaging module 2 is a compound-eye imaging module including the microlens array 24 in which multiple microlenses 244 are provided.

When the frequency of an image formed on the image sensor 20 is fp (1/mm), the lower limit of the pattern image frequency (the upper limit of the pattern size 1/fp) preferably satisfies the following Expression 13 in order to prevent the pattern from being lost because of the size of the pattern larger than the ML image:

$$f_p > 1/L_{ML} \quad (13)$$

In the expression, $L_{ML}$ represents the pitch (mm) of the microlenses 244.

Furthermore, the upper limit of the pattern image frequency (the lower limit of the pattern size 1/fps) preferably satisfies the following Expression 14 in order to prevent the pattern from becoming too small to resolve:

$$f_p < 1/2d_{pix} \quad (14)$$

In the expression, dpix represents the pixel size (mm).

The manner in which the irradiator 12 emits light when a pattern of a size satisfying the upper limit and the lower limit expressed by the above Expressions 13 and 14 is projected will be described below. When the frequency of the pattern projected onto the object is Fpt (1/mm), distance measurement can be carried out on the corresponding microlens images if the relation between the pattern Fpt (1/mm) projected onto the object and the image frequency fp (1/mm) formed on the image sensor 20 satisfies the following Expressions 15 and 16.

$$f_P = F_{pt} \times M \times N \quad (15)$$

$$1/L_{ML} < F_{pt} \times M \times N < 1/2d_{pix} \quad (16)$$

Thus, the above Expression 16 can also be expressed as in the following Expression 17.

$$L_{ML} > \frac{1}{f_p} > 2d_{pix} \quad (17)$$

If all the microlenses 244 that form corresponding images satisfy the aforementioned condition, the condition under which distance can be measured is satisfied all over the corresponding image (screen).

Figure 10B:
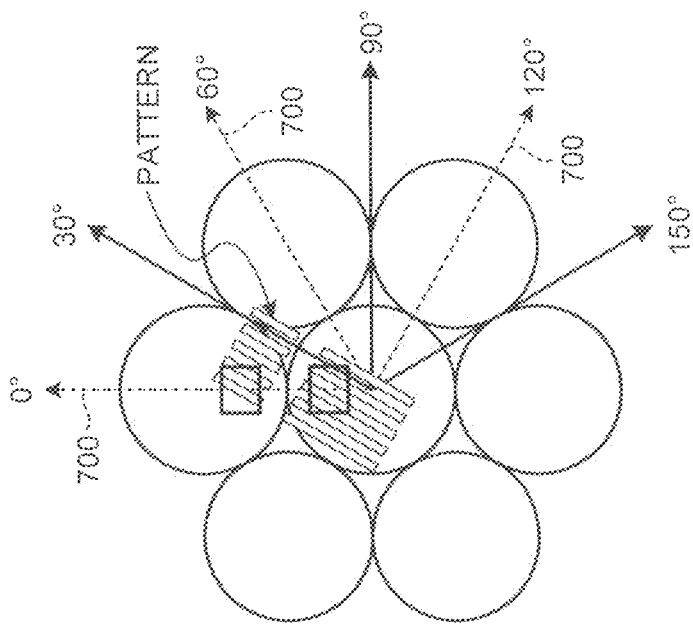
FIGS. 10A and 10B are schematic diagrams of pattern shapes suitable for the imaging system according to the embodiment.
Figure 10A:
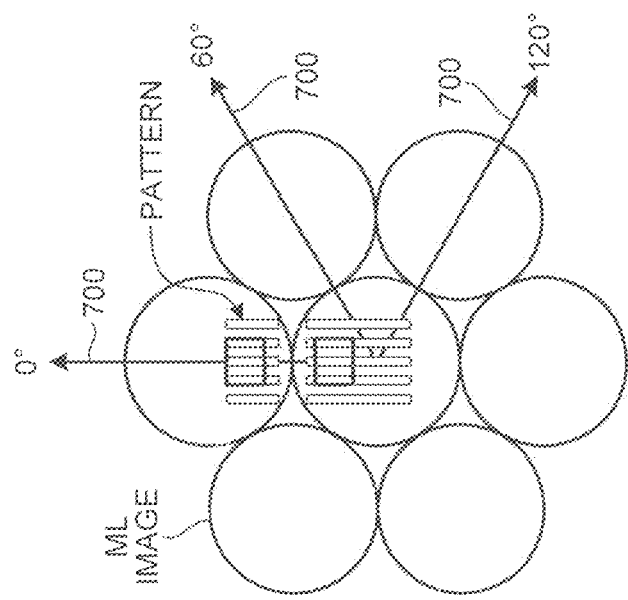

FIGS. 10A and 10B are diagrams schematically illustrating the shapes of the pattern suitable for the imaging system 1. When a projected pattern (texture) is parallel to search axes (epipolar lines) 700 connecting the centers of the microlens images, the shift amounts cannot be defined. Thus, the pattern is preferably projected in a state tilted between the search axes 700. Specifically, if the pattern is anisotropic, the irradiator 12 conducts irradiation so that the direction of the pattern is not parallel to the search axes.

Next, specific examples of the pattern will be described. Assume that the imaging system 1 performs reduction by a magnification N of about 1/2 to 1/10, for example. In this case, the pattern preferably has a shape combining multiple periods so that the texture (pattern) will be detected, whatever magnification in the range of 1/2 to 1/10 is used for reduction.

FIG. 11 illustrates a pattern combining random patterns with different periods. The pattern is suitably a pattern combining a random pattern of a certain period and random patterns of 1/2 and 1/4 of the period as illustrated in FIG. 11, for example.

Figure 12:
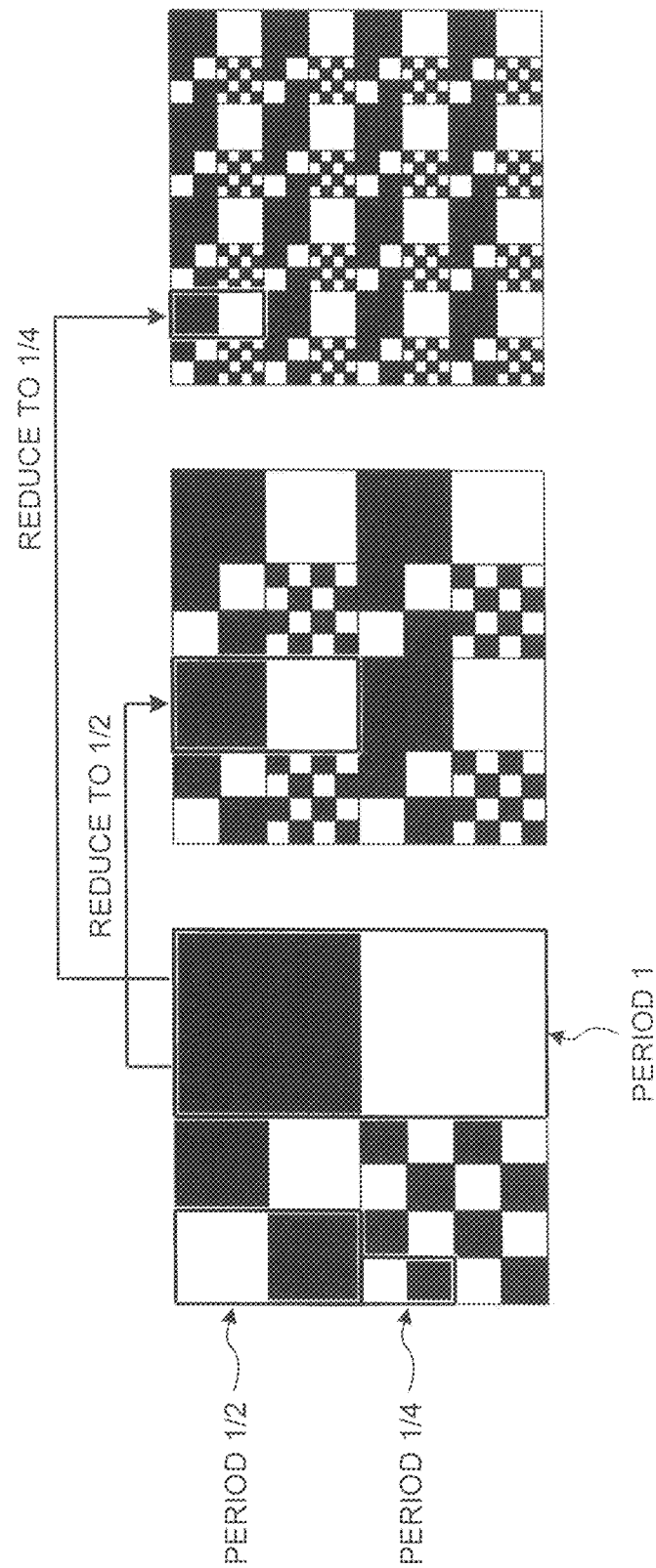
FIG. 12 is a diagram illustrating a first example of a periodic pattern combining multiple periods.
Figure 13:
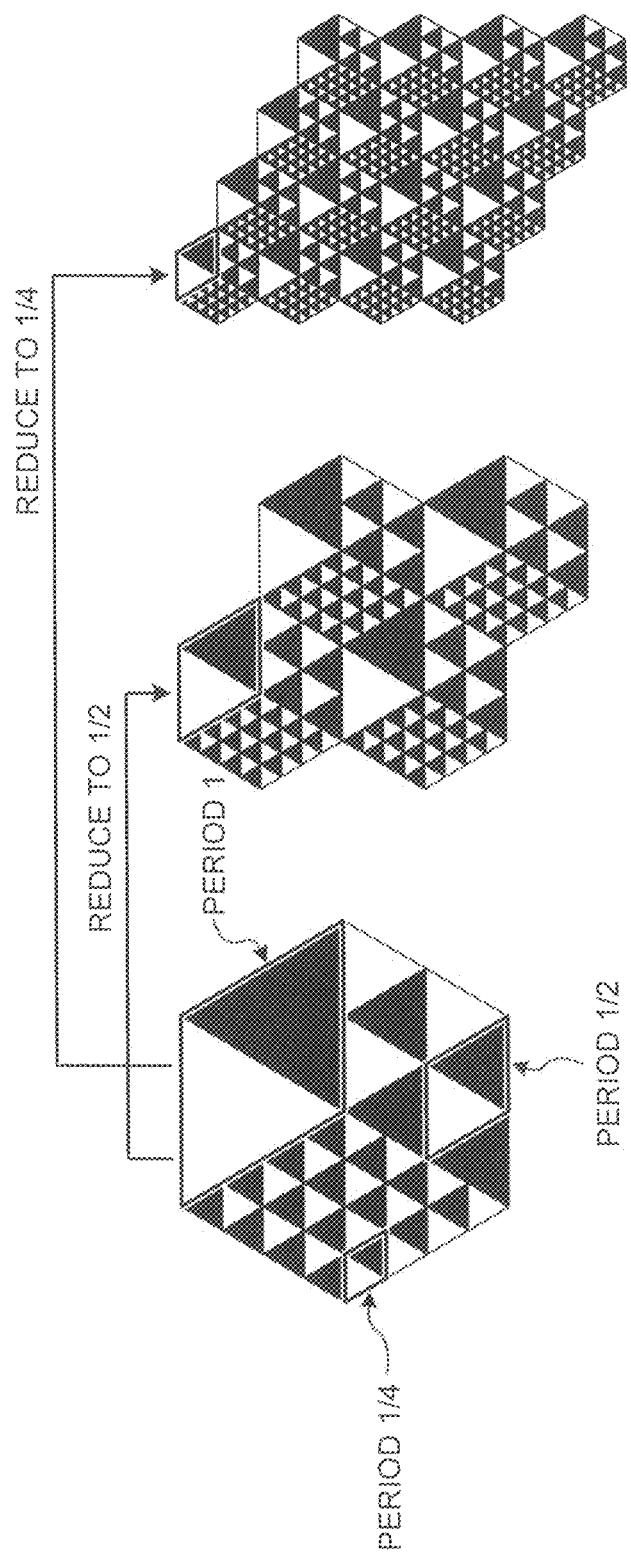
FIG. 13 is a diagram illustrating a second example of a periodic pattern combining multiple periods.
Figure 14:
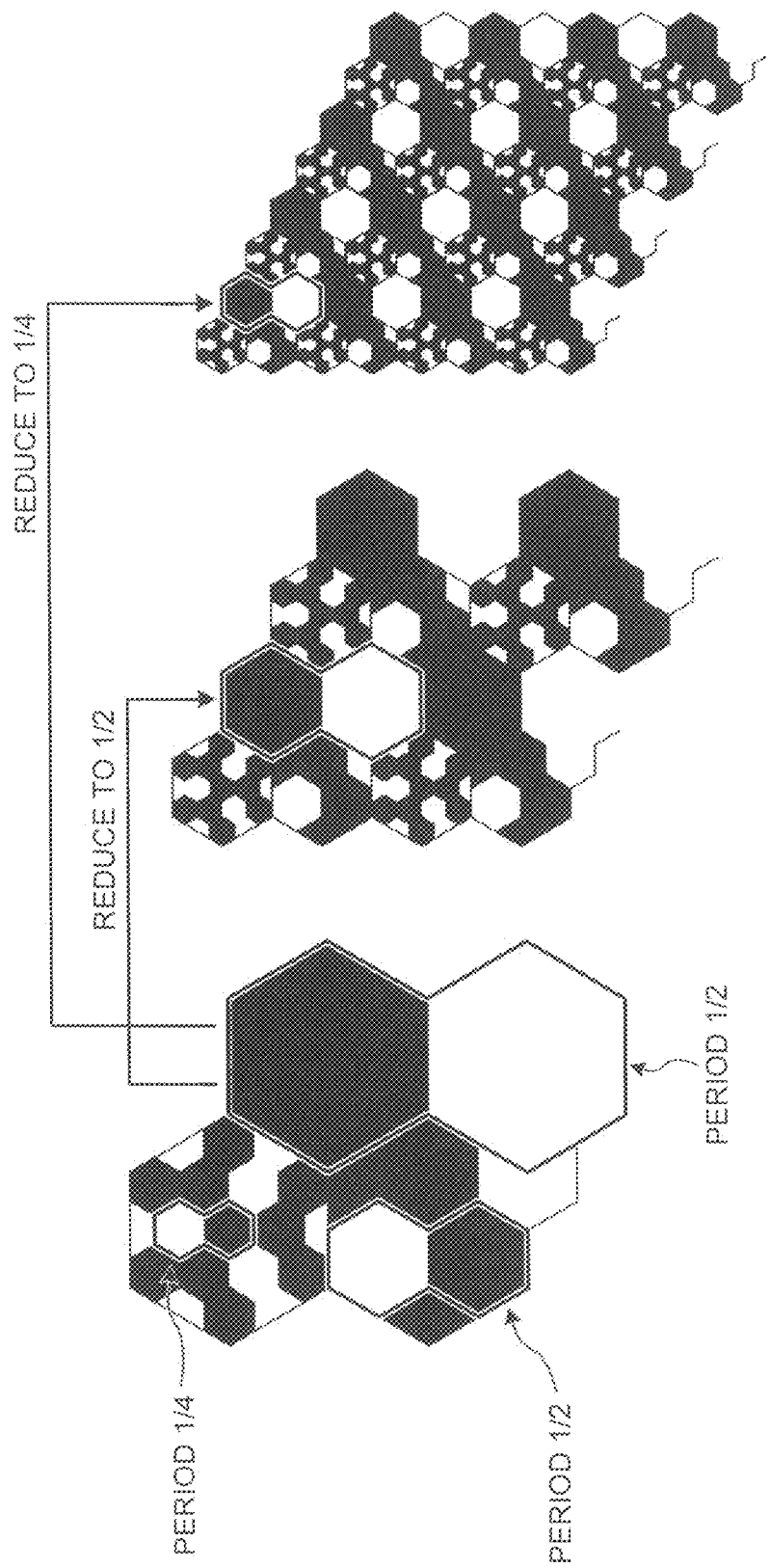
FIG. 14 is a diagram illustrating a third example of a periodic pattern combining multiple periods.

Furthermore, as illustrated in FIGS. 12 to 14, such a pattern combining periods of squares, triangles, hexagons, or the like is also suitable for the imaging system 1 since a white and black pattern (a pattern in a frame) of the same periods can be seen, whatever magnification is used for reduction. Thus, the irradiator 12 may emit light projecting a fractal (self-similar) pattern.

Furthermore, when the irradiator 12 can change the size of the pattern to be projected like a projector or the like, the controller 50 may control light emitted by the irradiator 12 so as to change the pattern size on the basis of an image taken by the imaging module 2.

Figure 15:
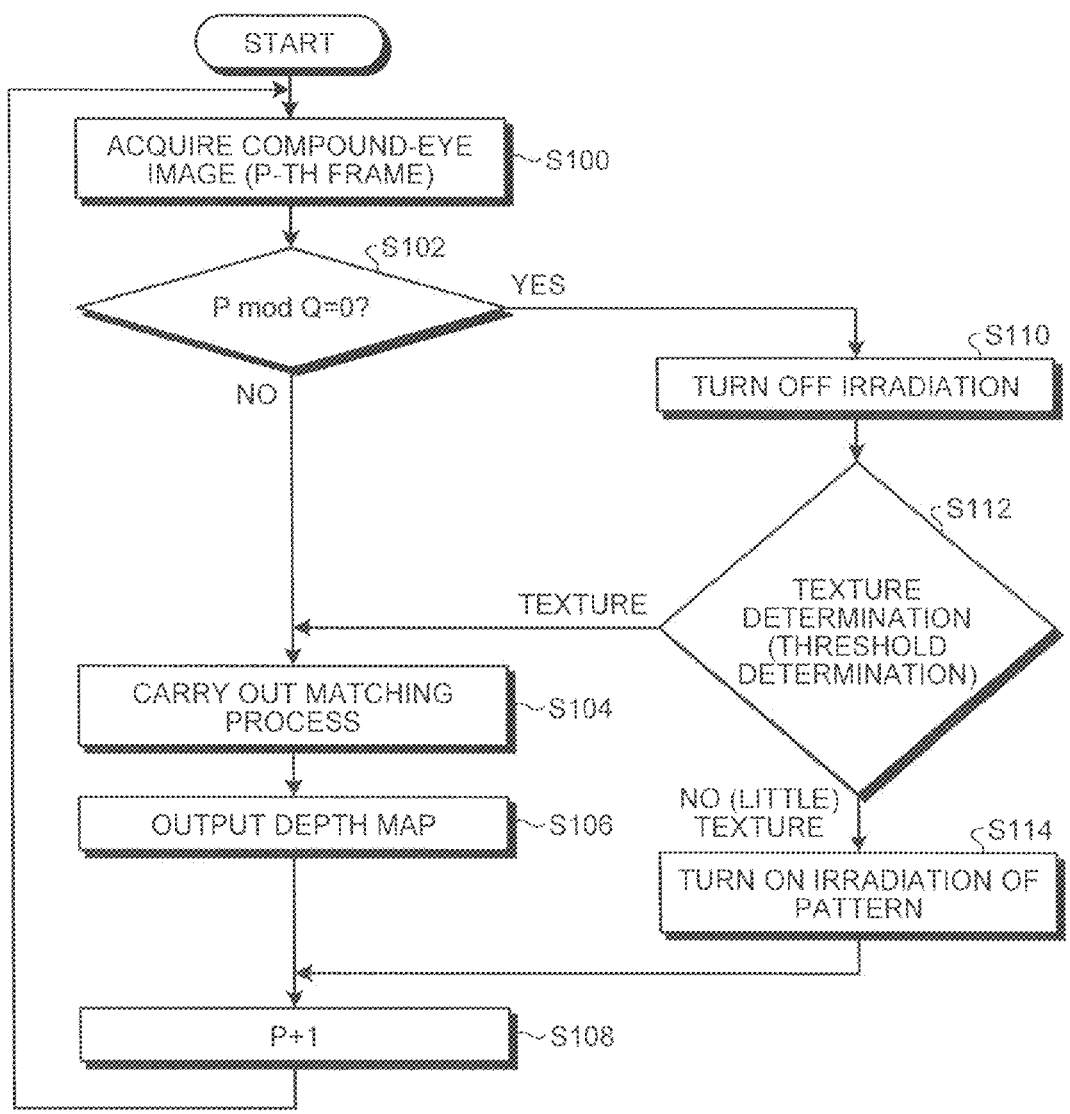
FIG. 15 is a flowchart illustrating an example of operation of the imaging system according to the embodiment.

Next, the determining unit 52 will be described. FIG. 15 is a flowchart illustrating an example of operation of the imaging system 1 that operates on the basis of the texture of the object. In step 100 (S100), the controller 50 acquires multiple ML images (compound-eye image) of a P-th frame (P is an integer representing the number of frames) via the signal processor 42.

In step 102 (S102), the controller 50 causes the determining unit 52 to determine whether or not the depth map generator 44 can acquire distance information (whether or not the depth map generator 44 can generate a depth map) from light from the object for every predetermined Q frames (Q is an integer representing a period using the number of frames). Specifically, the controller 50 determines whether or not the result of computation (P mod Q) is 0. If the result of computation is not 0 (S102: No), the controller 50 causes the ISP 4 (the depth map generator 44) to carry out processing in S104. If the result of computation is 0 (S102: Yes), the controller 50 proceeds to processing in S110.

In step 104 (S104), the ISP 4 (the depth map generator 44) carries out a matching process by using multiple ML images (compound-eye image) at the P-th frame, for example.

In step 106 (S106), the ISP 4 (the depth map generator 44) outputs a depth map.

In step 108 (S108), the controller 50 increments P (P+1) to count the number of frames.

In step 110 (S110), the controller 50 controls the irradiator 12 to turn off emission of light for projecting a pattern by the irradiator 12.

In step 112 (S112), the determining unit 52 determines whether or not texture is present on the object. Specifically, the determining unit 52 determines whether or not texture is present on the object on the basis of a threshold by using the ML images (compound-eye image) at the P-th frame to determine whether or not the depth map generator 44 can acquire the distance information (whether or not the depth map generator 44 can generate a depth map), for example. If the determining unit 52 determines that the depth map generator 44 can acquire the distance information (S112: texture is present), the controller 50 causes the ISP 4 (the depth map generator 44) to carry out the processing in S104. If the determining unit 52 determines that the depth map generator 44 can not acquire the distance information (S112: no (little) texture), the controller 50 proceeds to processing in S114.

In step 114 (S114), the controller 50 controls the irradiator 12 to turn on emission of light for projecting a pattern by the irradiator 12, and proceeds to the processing in S108 (or S100).

Alternatively, the imaging system 1 may first turn off emission of light for projecting a pattern by the irradiator 12, acquire a visible image, and carry out texture determination (threshold determination). If the texture on the object is little (smaller than a predetermined threshold), the imaging system 1 then emits light for projecting a pattern and outputs a depth map by using reflected light of the pattern. If the texture on the object is sufficient, the imaging system 1 outputs the depth map without emitting the light for projecting the pattern.

Alternatively, the imaging system 1 may be configured to adjust the gain of the image sensor 20 on the basis of the contrast of the pattern determined from a read image when the light for projecting the pattern is emitted, or may be configured to carry out automatic gain control on the intensity of light emitted by the irradiator 12. The controller 50 may control ON/OFF of the irradiator 12 to cause the irradiator 12 to simply operate intermittently.

As described above, when the imaging system 1 is provided with the determining unit 52, ON/OFF of the irradiator 12 can be determined depending on the scene of use such as the brightness of the environment and the colors of the object. The imaging system 1 can therefore reduce power consumption as compared to the case where the irradiator 12 continuously emits light (ON) (the case where the irradiator 12 is a completely active device). Furthermore, with the imaging system 1, the dependency of the texture of the object, the influence of illumination, and the like on the scene is decreased and the distance information can be acquired more frequently as compared to a completely passive device without any light source.

FIRST MODIFIED EXAMPLE

Figure 16A:
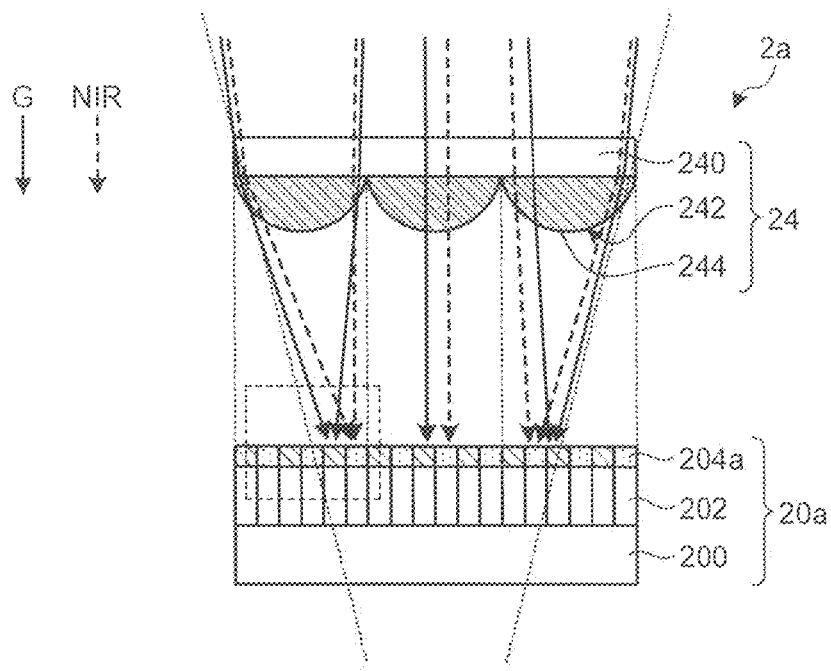
FIGS. 16A to 16C are diagrams illustrating a first modified example of the imaging system according to the embodiment.
Figure 16B:
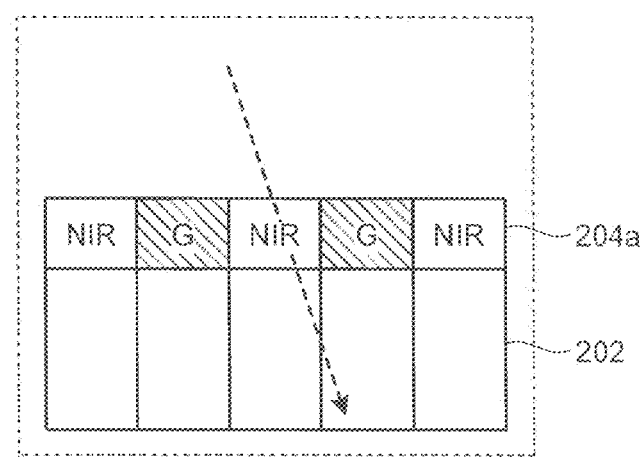
Figure 16C:
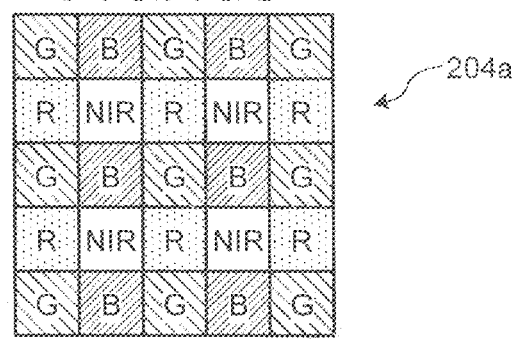

Next, a first modified example of the imaging system 1 will be described. FIGS. 16A to 16C are diagrams illustrating an outline of the first modified example (main part of an imaging module 2a) of the imaging system 1. FIG. 16A illustrates a partial cross section of the imaging module 2a. FIG. 16B is an enlarged view around color filters 204a in FIG. 16A. FIG. 16C illustrates an example of an array of the color filters 204a. Note that components in the imaging module 2a illustrated in FIGS. 16A to 16C which are substantially the same as those in the imaging module 2 (FIG. 2, etc.) are represented by the same reference numerals.

In the first modified example of the imaging system 1, the irradiator 12, which is not illustrated, emits light in the near-infrared (NIR: invisible rays) wavelength range of about 750 to 900 nm to project a pattern in the near-infrared range onto the object, and the imaging module 2a reads the pattern in the near-infrared range. An image sensor 20a includes color filters 204a each provided with a filter of R, G, B, or NIR for each pixel.

When the image sensor 20a outputs light only from pixels provided with the NIR filters, the image captured by the image capturing unit 41 is an image of the pattern in the near-infrared range projected onto the object. The depth map generator 44 then generates a depth map by using the image of the pattern in the near-infrared range. The reconstructing unit 43 then demosaics the pixels provided with filters of R, G, and B, and reconstructs a visible image by carrying out interpolation using peripheral pixels for pixels provided with the NIR filters. In this case, only light in the visible range is read but the pattern in the near-infrared range is not read in the visible image. Thus, according to the first modified example of the imaging system 1, an image of the object as viewed by human eyes can be taken.

SECOND MODIFIED EXAMPLE

Figure 17A:
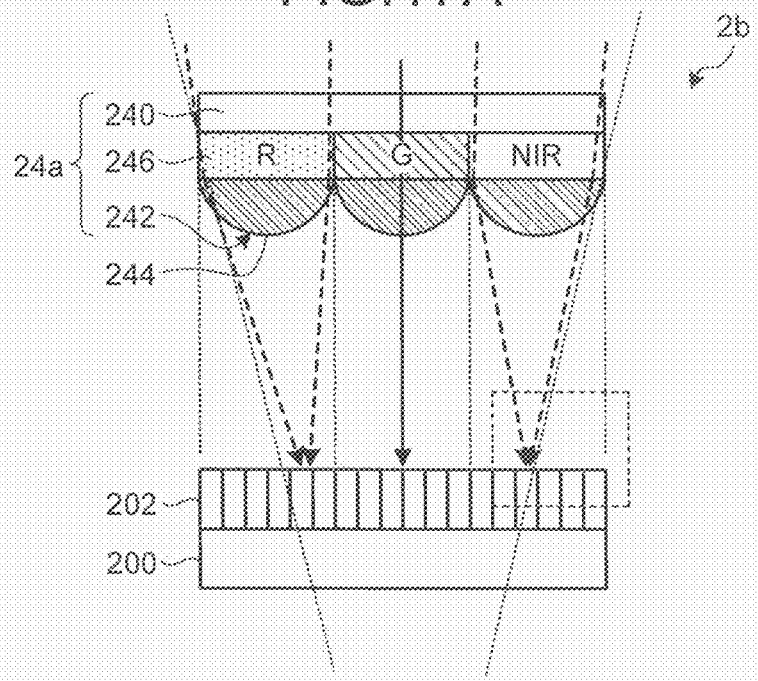
FIGS. 17A and 17B are diagrams illustrating a second modified example of the imaging system according to the embodiment.
Figure 17B:
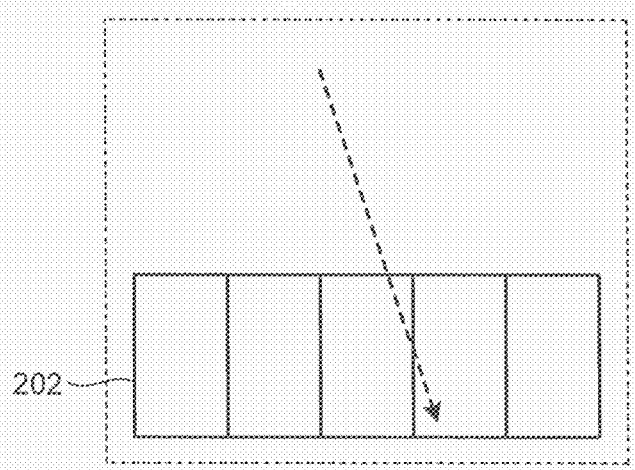

Next, a second modified example of the imaging system 1 will be described. FIGS. 17A and 17B are diagrams illustrating an outline of the second modified example (main part of an imaging module 2b) of the imaging system 1. FIG. 17A illustrates a partial cross section of the imaging module 2b. FIG. 17B is an enlarged view around pixels 202 in FIG. 17A. Note that components in the imaging module 2b illustrated in FIGS. 17A and 17B which are substantially the same as those in the imaging module 2 (FIG. 2, etc.) are represented by the same reference numerals.

In the second modified example of the imaging system 1, the irradiator 12, which is not illustrated, emits light in the near-infrared (NIR) wavelength range of about 750 to 900 nm to project a pattern in the near-infrared range onto the object, and the imaging module 2b reads the pattern in the near-infrared range. A microlens array 24a includes microlens color filters (ML color filters) 246 each provided with a filter of R, G, B or NIR for each microlens 244. According to the second modified example of the imaging system 1, a depth map can be generated by carrying out pattern matching on images formed by the microlenses 244 provided with NIR filters, and a visible image can be reconstructed by using images formed by the microlenses 244 provided with filters of R, G, and B.

As described above, with the imaging system according to the embodiment, since the irradiator is controlled so that images contained in a pattern that is reflected by the object and scaled down on the image sensor by the imaging optical system and the microlenses are smaller than the arrangement pitch of images each formed on the image sensor by each microlens and larger than twice the pixel, the information on the distance in the depth direction to the object can be acquired without degrading the accuracy owing to misalignment in installation and without depending on the object.

Thus, the imaging system 1 can also estimate the distance to an object having no texture. Furthermore, since the imaging system 1 includes one camera, that is, a single sensor (image sensor 20) and has a base line length that is not between cameras but that is determined by the intervals between adjacent microlenses formed with high accuracy according to a micromachining technology, it is not necessary to perform alignment between cameras and with a light source and it is possible to prevent degradation in the accuracy caused by misalignment. Furthermore, the imaging system 1 can achieve lower power consumption by making the irradiator 12 operate intermittently or periodically.

Furthermore, since it is only necessary that certain texture be projected onto the object, interference does not occur even when multiple imaging systems 1 are used at the same time. As described above, the imaging system 1 can acquire a visible image and a depth map at the same time by a single device, achieve a smaller size and lower power consumption, and improve the probability of distance measurement as a result of being less dependent on the object.

The imaging system 1 can be more easily embedded in various devices as a result of being smaller in size, which contributes to miniaturization of products such as portable digital assistants and home electric appliances. Furthermore, the imaging system 1 can be applied to the field of machine vision in which embedded components are required to be low in power consumption, small and lightweight such as those mounted in various industrial robots, robot arms, endoscopes, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imaging system comprising:
   an image sensor that includes multiple pixel blocks each containing multiple pixels configured to carry out photoelectric conversion;
   an imaging lens configured to focus light from an object onto a virtual imaging plane;
   a microlens array that is provided between the image sensor and the imaging lens and includes multiple microlenses arranged with a predetermined pitch, the microlenses being respectively associated with the pixel blocks;
   an irradiator configured to emit light to project a pattern onto the object;
   a distance information acquiring unit configured to acquire information on distance in a depth direction to the object on the basis of a signal resulting from photoelectric conversion performed by the image sensor; and
   a controller configured to control the irradiator so that the pattern formed on the image sensor satisfies the following expressions (1) and (2):

$$fp = Fpt \times M \times N \quad (1), \text{ and}$$

$$1/L_{ML} < Fpt \times M \times N < 1/2d\text{pix} \quad (2),$$

where fp represents a frequency of an image formed on the image sensor, Fpt represents a frequency of the pattern, M represents a magnification of the imaging lens, N represents a magnification of the microlenses, $L_{ML}$ represents a distance between the microlenses, and dpix represents a pixel size.

2. The system according to claim 1, wherein the irradiator emits light to project a periodic pattern combining a plurality of different periods or a pattern combining a plurality of random patterns of different periods.

3. The system according to claim 1, wherein the irradiator emits light to project a fractal pattern.

4. The system according to claim 1, wherein the controller performs control to switch on and off of light emitted by the irradiator.

5. The system according to claim 4, further comprising a determining unit configured to determine whether or not the distance information acquiring unit can acquire the information on distance on the basis of a signal resulting from photoelectric conversion performed by the image sensor when the light emitted by the irradiator is turned off, wherein
   when the determining unit determines that the distance information acquiring unit cannot acquire the information on distance, the controller performs control to switch on the light emitted by the irradiator.

6. The system according to claim 1, wherein
   the irradiator emits invisible light rays to project the pattern, and
   the image sensor performs photoelectric conversion on the invisible light rays by some of the pixels via filters transmitting the invisible light rays reflected by the object in a detectable manner.

* * * * *